United States Patent
Cho

(10) Patent No.: US 9,829,515 B1
(45) Date of Patent: Nov. 28, 2017

(54) HAND-HELD VOLTMETER FOR ELECTRIC FENCE

(71) Applicant: Byung-Hak Cho, Daejeon (KR)

(72) Inventor: Byung-Hak Cho, Daejeon (KR)

(73) Assignee: Byung-Hak Cho, Daejeon (KR)

( * ) Notice: Subject to any disclaimer, the term of this patent is extended or adjusted under 35 U.S.C. 154(b) by 0 days.

(21) Appl. No.: 15/247,971

(22) Filed: Aug. 26, 2016

(30) Foreign Application Priority Data

May 25, 2016 (KR) .......................... 10-2016-0063810

(51) Int. Cl.
*G01R 1/00* (2006.01)
*G01R 19/04* (2006.01)
*G01R 13/00* (2006.01)
*G01R 15/00* (2006.01)

(52) U.S. Cl.
CPC .............. *G01R 19/04* (2013.01); *G01R 13/00* (2013.01)

(58) Field of Classification Search
CPC  G01R 1/06777; G01R 1/06788; G01R 15/04; G01R 15/06; G01R 15/16; G01R 19/04
See application file for complete search history.

(56) References Cited

U.S. PATENT DOCUMENTS

| | | | | |
|---|---|---|---|---|
| 6,198,403 B1 * | 3/2001 | Dorrough | .......... | G01R 19/2513 324/103 R |
| 2002/0135349 A1 * | 9/2002 | Steber | ................ | G01R 1/06788 324/72.5 |
| 2015/0346238 A1 * | 12/2015 | Javora | ...................... | G01R 1/04 324/126 |
| 2016/0020075 A1 * | 1/2016 | Lemson | ................ | G01R 15/26 324/96 |

FOREIGN PATENT DOCUMENTS

| JP | 07218560 A | 8/1995 |
|---|---|---|
| JP | 03145408 B | 9/2008 |

OTHER PUBLICATIONS

Glen McGillan, "The Design of an Electric Fense Fault-Finder", 2009, Massey Research Online.*
Glen McGillan, The design of an electric fence fault finder, M. Sc. Thesis, Massey University New Zealand, 2009.

* cited by examiner

*Primary Examiner* — Daniel Dobson

(57) ABSTRACT

The present disclosure relates to a hand-held voltmeter measuring a peak voltage of a high voltage pulse applied to an electric fence. The voltmeter includes a body case of which one side has an opening, a sensor case protruded from the opening of the body case, a voltage divider disposed over the inside and the outside of the sensor case for dividing the high voltage pulse into a low divided voltage, a peak detector for detecting the peak voltage of the divided voltage, a display unit for displaying the peak voltage, and an MCU for controlling the input and the output of the elements constituting the voltmeter. According to the present disclosure, an electric fence voltmeter that measures the peak voltage accurately without need to make a ground connection to the earth, and has a low risk of an electric shock during a measurement is provided.

8 Claims, 2 Drawing Sheets

HAND-HELD VOLTMETER FOR ELECTRIC FENCE

BACKGROUND OF THE INVENTION

Field of the Invention

The present disclosure relates to a voltmeter for measuring the peak voltage of a high voltage pulse applied to an electric fence. More particularly, the present disclosure relates to the electric fence voltmeter having high measurement coupling factor that eliminates the need for connecting the ground terminal of the voltmeter to the earth. The high coupling factor can be achieved by optimizing the distribution of various stray capacitances acting on the voltmeter.

Related Art

An electric fence prevents the intrusion of wild animals, or the escape of livestock cultivated in the fence. A pulse shaped high voltage generated from an energizer is applied between the earth and the fence wire which is supported by the insulators installed around fence posts. If an animal is in contact with the fence wire, a strong pain is caused by an electric shock due to the circulating current flowing through the animal.

Most of the electric fence energizer has a transformer that has more turns on the secondary winding than the primary to generate a high voltage pulse having a peak value of 2 kV to 10 kV. The high voltage pulse is induced from the secondary winding of the transformer when the electric charge stored in an energy storage capacitor is discharged through the primary winding. The reason for raising the fence voltage up to 10 kV is to breakdown the electrical insulating effect that the animal hairs have.

The period of applying high voltage pulses to the electric fence wire is usually 0.75 to 1.5 seconds, and the pulse duration is 5 to 500 microseconds. The high voltage pulses have normally positive polarity relative to the ground, but may also have a negative polarity.

Sometimes, the electric fence experiences unwanted low voltage on the fence wire due to the various reasons including the failure of the electric fence energizer itself, the fence wire in contact with trees or weeds, the broken or sagging fence wire on the ground, and the broken insulators.

Once the fence voltage is lowered, the current flowing through the animal becomes weak or may not flow at all. Thus, in order to maintain the electric fence effectively, the voltage applied to the fence wire must be measured frequently by using an adequate voltmeter to ensure that a predetermined high voltage is applied.

In JP Pat. No. 03145408 U, issued to Tiger company, on Sep. 17, 2008, the patent discloses a non-contact type portable voltage measuring device for electric fences. The device utilizes the phenomenon that the intensity of the electromagnetic wave emitted from the electric fence wire to the surroundings is proportional to the strength of the voltage applied to the wire. The electromagnetic wave signal detected by the antenna of the device is amplified by a high gain amplifier. The device is easy to use in a non-contact manner without need to make a ground connection to the earth. However, this device has a problem with a poor measurement accuracy especially when the fence voltage is low.

Detailed discussion on recent technologies is provided in "The design of an electric fence fault finder", M. Sc. Thesis, Massey University New Zealand by Glen McGillan (2009), pp 123-130. The article describes a detailed design of the peak voltage detecting circuits. The voltage measuring circuits are based on a resistor voltage divider of which the output is fed to additional two peak detector circuits to provide the peak voltages of both positive and negative pulses. The peak voltages are read by A/D (analog to digital) conversion channels of an MCU (micro controller unit) and displayed on a display unit. The test result shows that the voltage readings taken without an earth connection are approximately 10% lower than the readings taken when the earth connection is present.

Thus, referring to the prior art literature and the commercially available products, it becomes evident that the electric fence voltmeter based on known technologies has to be grounded to the earth to measure a voltage adequately.

In more detail, a ground rod connected to a ground terminal of the voltmeter via a lead wire has to be inserted into the earth prior to contacting the probe of the voltmeter to the fence wire. In this reason, the measurement process of the conventional voltmeters is known to be too cumbersome, and takes long time to use.

In addition, since the high voltage probe of the conventional voltmeter is usually disposed close to the case, it may inadvertently cause an electric shock to a user during a measurement.

SUMMARY OF THE INVENTION AND ADVANTAGES

The present disclosure is directed to an electric fence voltmeter which overcomes the problems arising from the known electric fence voltmeters.

An electric fence voltmeter in a generic aspect of the present disclosure may include: a body case 60 of which one side has an opening; a sensor case 61 connected to the opening of the body case 60 to protrude from the body case 60; a voltage divider 10 disposed over the inside and the outside of the sensor case 61 for dividing the high voltage pulse Vp applied to a probe 11 into a low divided voltage V2; a peak detector 20 for detecting the peak voltage of the divided voltage V2; a display unit 40 for displaying the peak voltage; and an MCU 30 for controlling the input and the output of the elements constituting the voltmeter 1.

The electric fence voltmeter 1 may have a sufficiently high measurement coupling factor enough to eliminate the need for connecting the ground of the voltmeter to the earth. The measurement coupling factor is defined as the ratio of the voltage detected from the voltmeter to the voltage applied to the electric fence.

More specifically, the measurement coupling factor may be increased by adequately arranging the various stray capacitances acting on the voltmeter.

In order to provide a means for setting up the voltage division ratio, the voltage divider 10 may have a capacitance adjuster.

According to the exemplary embodiments, the present disclosure provides a voltmeter that can measure the peak voltage of an electric fence accurately without need to make a ground connection to the earth, thereby having an advantage of becoming easy to use and allowing quick measurement.

In addition, the voltmeter has a low risk of an electric shock during the measurement.

DETAILED DESCRIPTION OF THE INVENTION

The present disclosure may be understood more readily by reference to the following detailed description of embodiments and the accompanying drawings. However, the present disclosure may be embodied in many different forms, and should not be construed as being limited to the embodiments set forth herein. Rather, these embodiments are provided so that this disclosure will be thorough and complete and will fully convey the concept of the invention to those skilled in the art, and the present disclosure will only be defined by the appended claims.

The terminology used herein is defined in consideration of the function of corresponding elements used in the present disclosure and may be varied according to users, operator's intention, or practices. In addition, an arbitrarily defined terminology may be used in a specific case and will be described in detail in a corresponding description paragraph. Therefore, the terminology used herein is for the purpose of describing particular embodiments only and is not intended to be limiting of the invention.

Figure 1:
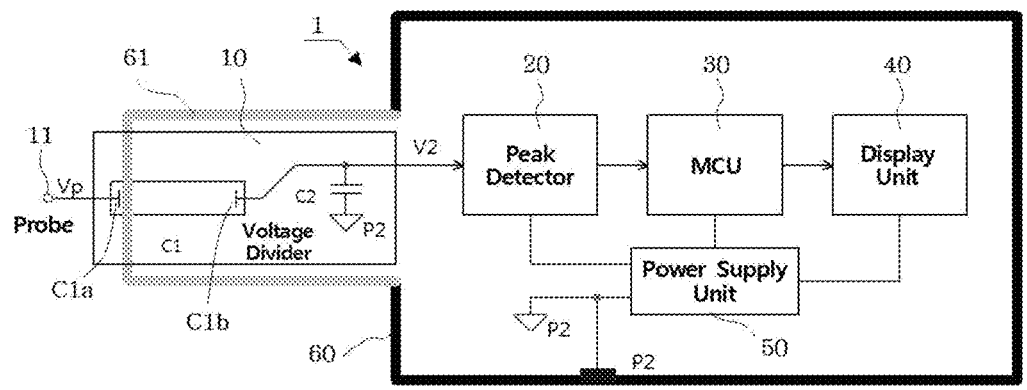
FIG. 1 is a block diagram of the electric fence voltmeter according to the present disclosure.

Referring to FIG. 1, the electric fence voltmeter 1 includes:

a body case 60 of which one side has an opening;

a sensor case 61 connected to the opening of the body case 60 to protrude from the body case 60;

a voltage divider 10 disposed over the inside and the outside of the sensor case 61 for dividing the high voltage pulse Vp applied to a probe 11 into a low divided voltage V2;

a peak detector 20 for detecting the peak voltage of the divided voltage V2;

a display unit 40 for displaying the peak voltage; and an MCU 30 for controlling the input and the output of the elements constituting the voltmeter 1.

The voltmeter 1 further includes a power supply unit 50 for supplying electric power to the elements constituting the voltmeter.

Now, the working principle of a voltage divider 10 according to the present disclosure will be described in detail.

Figure 2:
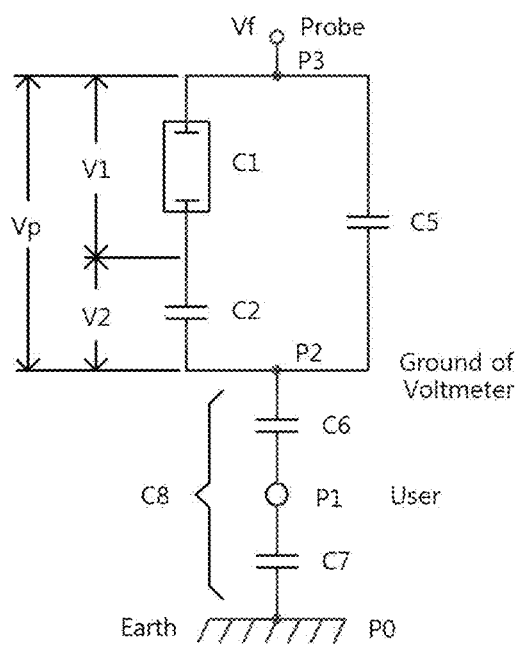
FIG. 2 is an equivalent circuit of stray capacitances acting on the voltage divider.

Referring to FIGS. 1 and 2, the voltage divider 10 is a capacitor voltage divider composed of a capacitor C1 of which the first electrode C1$a$ is connected to a probe 11, and a capacitor C2 of which one electrode is connected to the second electrode C1$b$ of the capacitor C1 and the other electrode is connected to a ground P2.

When a high voltage is applied between the probe 11 and the ground P2, a circulating current flows through the capacitor C1 for charging the capacitor C2. At this time, the capacitors C1 and C2 are charged with the same amount of electric charge (Q). Thus, the capacitors C1 and C2 have the voltage potential of V1=Q/C1, and V2=Q/C2. In the formula, C1 and C2 represent the capacitances of the capacitor C1 and C2, respectively.

The voltage division ratio (Rd) is expressed as the divided voltage V2 divided by the input voltage Vp. In other words, the voltage division ratio (Rd) is V2/Vp, or V2/(V1+V2).

The voltage division ratio (Rd) can be expressed with the capacitance of the capacitors C1 and C2, as shown in equation (1).

$$Rd = \frac{C1}{C1+C2} \quad (1)$$

According to equation (1), it can be seen that the capacitance of the capacitor C1 needs to be small and that of the capacitor C2 needs to be large to make the voltage division ratio (Rd) small to be suited for measuring a high voltage applied to an electric fence.

The present discloser is to simplify the complicated measurement process that the prior art has. In other words, the present discloser is to provide an electric fence voltmeter having high measurement coupling factor so that the voltmeter is able to measure accurately even if the readings are taken without a ground connection to the earth. The high coupling factor may be achieved by optimizing the distribution of various stray capacitances acting on the voltmeter through the shape and arrangement of the voltage divider 10.

Now, referring to the FIG. 2, the various stray capacitances acting on the electric fence voltmeter 1 will be described.

FIG. 2 shows the voltage dividing capacitors C1 and C2, a first stray capacitance C5 existing between the probe P3 and the ground P2 of the voltmeter, and a second stray capacitance C8 existing between the ground P2 of the voltmeter and the earth P0 via a user P1 who is holding the voltmeter.

The voltmeter measures the voltage Vp applied to both ends of the voltage divider 10 instead of the voltage Vf applied between the electric fence wire and the earth. Referring to FIG. 2, the relationship between the voltages Vf and Vp is shown in equation (2).

$$Vp = \frac{C8}{\frac{C1 \cdot C2}{C1+C2} + C5 + C8} \cdot Vf = K \cdot Vf \quad (2)$$

In equation (2), the proportional constant K is the measurement coupling factor of the electric fence voltmeter 1. Therefore, it can be seen that the measurement coupling factor is maximized by converging to 1 as the second stray capacitance C8 becomes larger. However, the measurement coupling factor is minimized by converging to zero as the capacitance C1·C2/(C1+C2) or the first stray capacitance C5 becomes larger.

That is, the second stray capacitance C8 needs to be large, and the capacitance C1·C2/(C1+C2) and the first stray capacitance C5 need to be small to increase the measurement coupling factor of the voltmeter 1. The term C1·C2/(C1+C2) is the capacitance of the voltage divider 10 where the capacitances C1 and C2 are connected in series.

The second stray capacitance C8 is determined by a third stray capacitance C6 existing between the user P1 and the ground P2 of the voltmeter 1, and a fourth stray capacitance C7 that exists between the user P1 and the earth P0. The capacity of the fourth stray capacitance C7 is known to be approximately 100 pF.

Therefore, the third stray capacitance C6 should be kept large to increase the second stray capacitance C8. To this end, the body case 60 where a user contacts with may be made of a conductive material and connected to the ground P2 of the voltmeter 1.

On the other hand, for example, in the case that the voltage divider 10 is to divide 10 kV into 1V, referring to equation (2), the capacitance of the capacitor C1 can be chosen to be as small as 0.1 pF to increase the measurement coupling factor of the voltmeter 1. In this case, the capacitance of the capacitor C2 is determined to be 1 nF from equation (1).

Since the capacitance of the capacitor C1 is so small, the electrodes of the capacitor C1 should be spaced at a significant distance apart from each other if the electrodes are placed in the air.

It is also necessary to decrease the stray capacitance C5 to improve the measurement coupling factor. It is accomplished by placing the first electrode C1$a$ of the capacitor C1 apart from the body of the voltmeter 1 at a significant distance, too.

In addition, the probe 11 which is connected to the first electrode C1$a$ of the capacitor C1 needs to be spaced apart from the body case 60 at a significant distance to prevent an electric shock to a user during a measurement.

Now, the first embodiment of the present disclosure which reflects the aforementioned design considerations will be described in detail.

Figure 3:
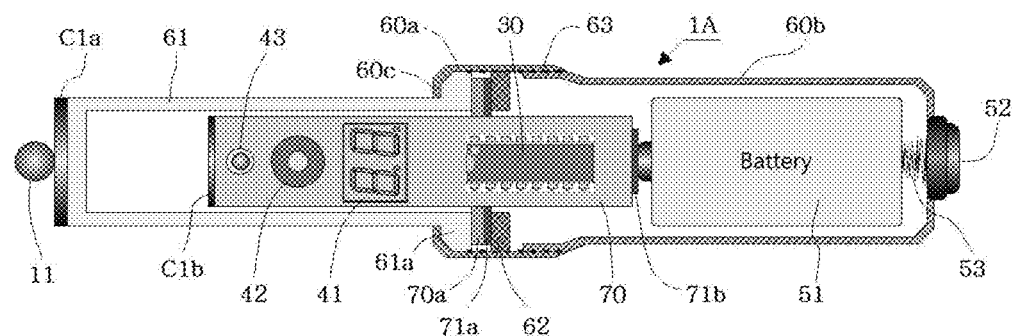
FIG. 3 is a plan view of the electric fence voltmeter according to the first embodiment of the present disclosure.

Referring to FIG. 3, in the first embodiment, the electric fence voltmeter 1A includes:

a cylindrical body case 60 of which one side has an opening;

a cylindrical sensor case 61 connected to the opening of the body case 60 to protrude from the body case 60;

a printed circuit board 70 in which a part of the voltage divider 10, the peak detector 20, the MCU 30, the display unit 40, and other electronic parts are assembled; and a power supply unit 50 for supplying electric power to the elements constituting the voltmeter.

The capacitor C1 of the voltage divider 10 has the first electrode C1$a$ placed on the outer end of the sensor case 61 in the form of a surface electrode, and the second electrode C1$b$ placed in the inside of the sensor case 61 in the form of a surface electrode that is spaced oppositely to the first electrode C1$a$ at a predetermined gap.

The body case 60 is composed of a first body case 60$a$ and a second body case 60$b$ being coupled by a screw thread type coupling means 63. The body cases 60$a$ and 60$b$ are made of a conductive material, and the sensor case 61 is made of a non-conductive material.

Locking protrusions 60$c$ and 61$a$ are formed on the inside of the first body case 60$a$ and the outside of the sensor case 61. The sensor case 61 inserted into the body case 60$a$ is engaged by the protrusions 60$c$ and 61$a$, and fixed each other by a screw thread type hollow fastening means 62 made of a conductive material.

At this time, a disc-shaped fixing member 70$a$ of the printed circuit board 70 formed around the board 70 is arranged between the protrusion 61$a$ and the fastening means 62. Thus, a negative power terminal 71$a$ placed on the surface of the fixing member 70$a$ is connected electrically to the body case 60$a$ via the conductive fastening means 62.

Aluminum can be applied as the conductive material, and a transparent plastic such as polycarbonate resin or acrylic resin can be applied as the non-conductive material for the sensor case 61.

Once the voltmeter 1 is assembled, the negative pole of the battery 51 is connected electrically to the ground P2 of the printed circuit board 70 via a spring 53, a switch 52, the body cases 60$a$ and 60$b$, the fastening means 62, and the negative power terminal 71$a$. The positive pole of the battery 51 is connected to the printed circuit board 70 via a positive power terminal 71$b$.

Accordingly, the electric potential of the conductive cases 60$a$ and 60$b$ becomes same with the potential of the negative pole of the battery 51 which is the ground P2 of the voltmeter 1.

When the switch 52 is turned on, the MCU 30 monitors the divided voltage V2 to detect the start of a pulse, and measures the peak voltage detected from the peak detector 20 at the peak of the pulse. The start of the pulse signal and the measured peak voltage are transmitted to the display unit 40.

The display unit 40 receives the start of the high voltage pulse and the measured peak voltage from the MCU 30, and may indicate them in the form of sound, light, characters, or a combination thereof.

For example, a buzzer 42 or an LED 43 can be used to make sound or emit light for indicating the occurrence of a high voltage pulse. In addition, it is possible to light a plurality of lamps (not shown) selectively depending on the strength of the measured voltage. Also, the measured voltage can be displayed in the form of characters through a character display unit 41.

Thus, the body case 60 and the sensor case 61 may have openings (not shown) for passage of sound and transparent parts (not shown) for passage of light so that the display unit 40 is recognized from the outside.

Figure 4:
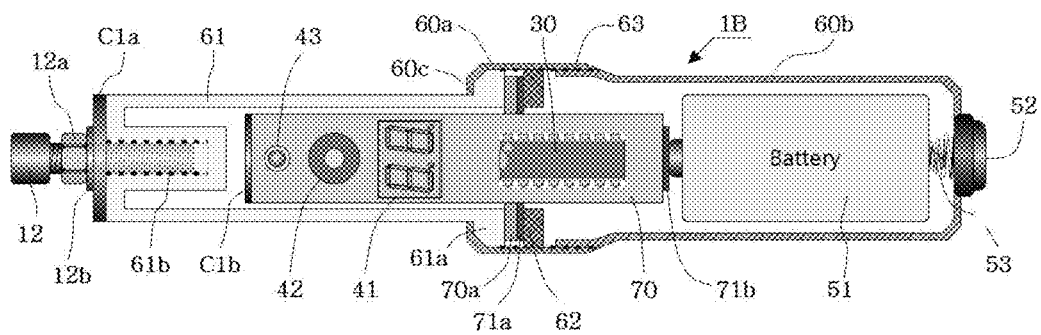
FIG. 4 is a plan view of the electric fence voltmeter according to the second embodiment of the present disclosure.

Meanwhile, referring to FIG. 4, in the second embodiment of the present discloser, the voltmeter 1B has a means for adjusting the capacitance of the capacitor C1 to set up the voltage division ratio (Rd). The capacitance of the capacitor C1 can be adjusted by modulating the equivalent distance between the first electrode C1$a$ and the second electrode C1$b$ of the capacitor C1.

That is, in the second embodiment, the electric fence voltmeter 1B further includes:

a bolt shaped capacitance adjuster 12 made of a conductive material screwed through a hole formed at the center of the first electrode C1$a$ of the capacitor C1 into a threaded blind hole 61$b$ formed inside of the sensor case 61 directed to the second electrode C1$b$; and a locking means 12$a$ for locking the screw coupling of the capacitance adjuster 12 and the threaded blind hole 61$b$ at an arbitrary position, on the electric fence voltmeter 1A.

The head of the bolt shaped capacitance adjuster 12 may also be used as the probe 11 of the voltmeter.

The locking means 12$a$ may be a nut type. The nut also has a function of fixing the first electrode C1$a$ of the capacitor C1 on the sensor case 61. To this end, a spring washer 12$b$ may be disposed between the nut and the electrode C1$a$.

In order to demonstrate the performance of the present disclosure, a prototype according to the second embodiment shown in FIG. 4 is fabricated. The major specification of the prototype is as follows: the voltage division ratio (Rd) is 1/10,000, the capacitance of C2 is 1 nF, and the protruded length of the sensor case 61 is 75 mm. The capacitance of C1 is obtained to be 0.1 pF by using the capacitance adjuster 12.

As a test result, the prototype voltmeter shows that the voltage readings taken without a ground connection to the earth are approximately 0.5% smaller than the readings taken with the ground connection. This degree of error may not cause problem in the electric fence voltmeter, besides the value is much smaller than the 10% error that the voltmeters of the prior art have.

The theoretical measurement coupling factor (K) of the prototype voltmeter can be obtained by equation (2) as follows:

Firstly, the capacitance of the human skin is known to be in the range of between 0.01uF and 0.05uF per square centimeter. Thus, assuming that the area for gripping the conductive body case 60 of the voltmeter 1 by hand is 50 square centimeters, the capacitance found at the contacting area amounts to at least 0.5uF, that is, the third stray capacitance C6 is chosen to be 0.5uF.

Secondly, the other design data necessary for computing the measurement coupling factor (K) are defined as follows: as mentioned previously, the fourth stray capacitance C7 is 100 pF, the capacitance of the capacitor C1 is 0.1 pF, and the capacitance of the capacitor C2 is 1 nF, and the first stray capacitance C5 is set equal to the capacitance of the capacitor C1. Note that the second stray capacitance C8 is obtained by a formula C8=C6·C7/(C6+C7).

By substituting the design data defined above into equation (2), the measurement coupling factor is obtained as K=0.998. That is, an error of only 0.2% can be found theoretically from the readings of the voltmeter even if the ground connection to the earth is not present.

The errors found from the performance test and the theoretical calculation show a slight difference. This is considered to be due to the first stray capacitance C5 having sensitive effect to the measurement coupling factor (K) is estimated a little bit smaller.

According to the specifications described so far, the present disclosure provides an electric fence voltmeter that measures the peak voltage accurately without need to make a ground connection to the earth, and has a low risk of an electric shock during a measurement is provided.

While this invention has been described in connection with what is presently considered to be practical exemplary embodiments, it is to be understood that the invention is not limited to the discovered embodiments, but, on the contrary, is intended to cover various modifications and equivalent arrangements.

| LIST OF REFERENCE NUMERALS | | | |
|---|---|---|---|
| 1 | hand-held voltmeter | 10 | voltage divider |
| 11 | probe | 12 | capacitance adjuster |
| 12a | locking means | 20 | peak detector |
| 30 | MCU | 40 | display unit |
| 50 | power supply unit | 51 | battery |
| 52 | switch | 53 | spring |
| 60 | body case | 61 | sensor case |
| 61b | threaded blind hole | 62 | fastening means |
| 63 | coupling means | 70 | printed circuit board |
| 71a | negative power terminal | 71b | positive power terminal |

What is claimed is:

1. An electric fence voltmeter, comprising:
    a body case (60) of which one side has an opening;
    a sensor case (61) connected to the opening of the body case (60) to protrude from the body case (60);
    a voltage divider (10) disposed over the inside and the outside of the sensor case (61) for dividing the high voltage pulse (Vp) applied to a probe (11) into a low divided voltage (V2);
    a peak detector (20) for detecting the peak voltage of the divided voltage (V2);
    a display unit (40) for displaying the peak voltage; and
    an MCU (micro controller unit) (30) for controlling the input and the output of the elements constituting the voltmeter.

2. The electric fence voltmeter of claim 1, wherein the voltage divider (10) is a capacitor voltage divider composed of a capacitor (C1) of which the first electrode (C1a) is connected to a probe (11), and a capacitor (C2) of which one electrode is connected to the second electrode (C1b) of the capacitor (C1) and the other electrode is connected to a ground (P2).

3. The electric fence voltmeter of claim 2, wherein the first electrode (C1a) of the capacitor (C1) is placed on the outer end of the sensor case (61) in the form of a surface electrode, and the second electrode (C1b) is placed in the inside of the sensor case (61) in the form of a surface electrode that is spaced oppositely to the first electrode (C1a) at a predetermined gap.

4. The electric fence voltmeter of claim 3, further comprising:
    a bolt shaped capacitance adjuster (12) made of a conductive material screwed through a hole formed at the center of the first electrode (C1a) of the capacitor (C1) into a threaded blind hole (61b) formed inside of the sensor case (61) directed to the second electrode (C1b); and
    a locking means (12a) for locking the screw coupling of the bolt shaped capacitance adjuster (12) and the threaded blind hole (61b) at an arbitrary position.

5. The electric fence voltmeter of claim 1, wherein the body case (60) is made of a conductive material, and the sensor case (61) is made of a non-conductive material.

6. The electric fence voltmeter of claim 5, wherein the body case (60) is made of an aluminum, and the sensor case (61) is made of a transparent plastic.

7. The electric fence voltmeter of claim 5, wherein the body case (60) is connected electrically to the ground (P2) of the voltmeter.

8. The electric fence voltmeter of claim 1, wherein:
    the display unit (40) further displays the start of the high voltage pulse; and
    the start of the pulse and the value of the measured peak voltage are displayed in the form of sound, light, characters, or a combination thereof.

* * * * *